(12) United States Patent
Cho

(10) Patent No.: US 10,512,949 B2
(45) Date of Patent: Dec. 24, 2019

(54) MICRO DRY ICE SNOW SPRAY TYPE CLEANING DEVICE

(71) Applicant: IMT CO., LTD., Suwon (KR)

(72) Inventor: Sung Ho Cho, Yongin (KR)

(73) Assignee: IMT CO., LTD., Suwon (KR)

( * ) Notice: Subject to any disclaimer, the term of this patent is extended or adjusted under 35 U.S.C. 154(b) by 30 days.

(21) Appl. No.: 15/738,059

(22) PCT Filed: Sep. 23, 2015

(86) PCT No.: PCT/KR2015/009990
§ 371 (c)(1),
(2) Date: Dec. 19, 2017

(87) PCT Pub. No.: WO2017/003024
PCT Pub. Date: Jan. 5, 2017

(65) Prior Publication Data
US 2018/0304317 A1   Oct. 25, 2018

(30) Foreign Application Priority Data
Jun. 30, 2015   (KR) ................. 10-2015-0093334

(51) Int. Cl.
*B08B 7/00*   (2006.01)
*B08B 15/00*   (2006.01)
(Continued)

(52) U.S. Cl.
CPC .......... *B08B 7/0021* (2013.01); *B05B 7/0884* (2013.01); *B08B 11/00* (2013.01);
(Continued)

(58) Field of Classification Search
CPC ..... A22C 11/12; A22C 11/122; G05B 19/416; G05B 2219/37347; G06K 7/10366;
(Continued)

(56) References Cited

U.S. PATENT DOCUMENTS 5,125,979 A    6/1992  Swain et al.
5,931,721 A *  8/1999  Rose .................... B08B 7/0092
                                                     451/39

(Continued)

FOREIGN PATENT DOCUMENTS

JP    2009-066982 A    4/2009
JP    2010-056309 A    3/2010
(Continued)

OTHER PUBLICATIONS

International Search Report for PCT/KR2015/009990 dated Sep. 23, 2015.

*Primary Examiner* — Benjamin L Osterhout

(57) ABSTRACT

The present invention relates to a dry cleaning technology for a cleaning a surface of an object to be cleaned by adiabatically expanding liquid carbon dioxide to generate sublimable dry ice particles and carrying the dry ice particles on high-speed carrier gas to be sprayed onto the surface of the object to be cleaned, wherein an end of a liquid carbon dioxide nozzle further protrudes to the outside relative to an end of a carrier gas nozzle to prevent a growth of dry ice particles in the carrier gas nozzle, a hydrophobic coating is formed on a surface of the liquid carbon dioxide nozzle to prevent a formation of water droplets and to prevent an occurrence of irregular dry ice particles, thereby effectively preventing damage to a surface of an object to be cleaned and being advantageous in an economical aspect by significantly reducing consumption of liquid carbon dioxide.

5 Claims, 3 Drawing Sheets

FIG. 1

(51) Int. Cl.
*B08B 11/00* (2006.01)
*B08B 15/04* (2006.01)
*B24C 1/00* (2006.01)
*B24C 9/00* (2006.01)
*B05B 7/08* (2006.01)
*B05B 14/30* (2018.01)
*B05B 7/06* (2006.01)
*H01L 21/02* (2006.01)
*B05B 9/00* (2006.01)

(52) U.S. Cl.
CPC ............ *B08B 15/007* (2013.01); *B08B 15/04* (2013.01); *B24C 1/003* (2013.01); *B24C 9/00* (2013.01); *B05B 7/066* (2013.01); *B05B 9/005* (2013.01); *B05B 14/30* (2018.02); *B08B 2203/0229* (2013.01); *H01L 21/02101* (2013.01)

(58) Field of Classification Search
CPC ....... B08B 7/021; B08B 11/00; B08B 15/007; B08B 7/066; B08B 2203/0229; B08B 9/005; B24C 9/00; B24C 1/003; B05B 7/0884; B05B 14/30; H01L 21/02101
See application file for complete search history.

(56) References Cited

U.S. PATENT DOCUMENTS

| | | | |
|---|---|---|---|
| 5,967,156 A * | 10/1999 | Rose | B08B 7/0092 134/7 |
| 6,695,686 B1 * | 2/2004 | Frohlich | B24C 1/003 239/433 |
| 2010/0192655 A1 * | 8/2010 | Carter | B08B 7/0014 72/40 |
| 2012/0094581 A1 * | 4/2012 | Sharma | B24C 1/003 451/38 |
| 2013/0306101 A1 | 11/2013 | Swanson et al. | |

FOREIGN PATENT DOCUMENTS

| | | | |
|---|---|---|---|
| KR | 10-2002-0069794 A | 9/2002 |
| KR | 10-2007-0011781 A | 1/2007 |
| KR | 10-0740827 B1 | 7/2007 |
| KR | 10-0893503 B1 | 4/2009 |
| KR | 10-2014-0042863 A | 4/2014 |
| KR | 10-2014-0047030 A | 4/2014 |

* cited by examiner ical field

The present invention relates to a dry cleaning device for a cleaning a surface of an object to be cleaned by adiabatically expanding liquid carbon dioxide ($CO_2$) to generate sublimable dry ice particles and carrying the dry ice particles on high-speed carrier gas to be sprayed onto the surface of the object to be cleaned, and more particularly, to a micro dry ice snow spray type cleaning device capable of effectively preventing damage to a surface of an object to be cleaned and significantly reducing consumption of liquid carbon dioxide by minimizing a generation of water droplets due to a decrease in temperature of a liquid carbon dioxide nozzle and a growth of dry ice particles (snow) by the water droplets since an end of the liquid carbon dioxide nozzle further protrudes to the outside relative to an end of a carrier gas nozzle.

MICRO DRY ICE SNOW SPRAY TYPE CLEANING DEVICE

CROSS REFERENCE TO RELATED APPLICATIONS PARAGRAPH

This application is a U.S. National Stage of PCT/KR2015/009990, filed Sep. 23, 2015, which claims the priority benefit of Korean Patent Application No. 10-2015-0093334, filed on Jun. 30, 2015 in the Korean Intellectual Property Office, the disclosures of which are incorporated herein by reference.

TECHNICAL FIELD

The present invention relates to a dry cleaning device for a cleaning a surface of an object to be cleaned by adiabatically expanding liquid carbon dioxide ($CO_2$) to generate sublimable dry ice particles and carrying the dry ice particles on high-speed carrier gas to be sprayed onto the surface of the object to be cleaned, and more particularly, to a micro dry ice snow spray type cleaning device capable of effectively preventing damage to a surface of an object to be cleaned and significantly reducing consumption of liquid carbon dioxide by minimizing a generation of water droplets due to a decrease in temperature of a liquid carbon dioxide nozzle and a growth of dry ice particles (snow) by the water droplets since an end of the liquid carbon dioxide nozzle further protrudes to the outside relative to an end of a carrier gas nozzle.

BACKGROUND ART

In general, in a process of manufacturing a flat panel display (FPD) such as a semiconductor, a liquid crystal display (LCD), or an organic liquid emitting diode (OLED), an air-blowing process is used to remove foreign materials such as particles occurring from a surrounding environment.

For example, in an automated optical inspection (AOI), which is a final step of a process of manufacturing the LCD display, since an object to be inspected is recognized as defective even if only one floating particle is placed on the object to be inspected, there is a need for a process of blowing a surface of the object to be inspected using air immediately before the automated optical inspection in order not to lower an inspection yield.

However, since a pixel size of a display recently continues to be reduced as compared with a conventional air-blowing cleaning technology in which particles of 10 μm or less are not removed, a dry cleaning technology having stronger cleaning power than the air-blowing cleaning technology is required.

The most representative dry cleaning technology is a dry ice snow spray type cleaning technology, and a cleaning technology of spraying sublimable dry ice particles (snow) formed by a phase change of liquid carbon dioxide onto the surface of the object to be cleaned and removing foreign materials such as particles by collision energy occurring at the time of the spraying has been proposed in U.S. Pat. No. 5,125,979.

In general, in a case in which the dry ice snow spray type cleaning technology is applied to an object having a solid surface such as a metal or a ceramic, since hardness of the dry ice is about 2.5 based on the Mohs hardness testing machine, there is little possibility of damaging the surface of the object, but since the surface of the object used in the process of manufacturing the semiconductor or the display is often very soft and is very sensitive to a small change due to characteristics of the material, the application of the dry ice snow spray type cleaning technology is very limited in a case in which the surface of the object to be cleaned is not completely prevented from being damaged.

Typically, in the application of the dry ice snow spray type cleaning technology, the cause of the damage to the surface of the object to be cleaned is because an impulse is increased due to a mass effect of particles when large dry ice particles which are irregularly grown collide with the surface of the object to be cleaned.

A mechanism in which the growth of the dry ice particle occurs will be described below. In a case in which a speed of liquid carbon dioxide is slowed down inside the liquid carbon dioxide nozzle after dry ice seed particles (snow) are generated, the dry ice particles around the liquid carbon dioxide nozzle are aggregated into one particle and the growth of the dry ice particles occurs.

Further, if the dry ice particles are adsorbed on a surface of an end of the liquid carbon dioxide nozzle, the growth of the dry ice particles instantaneously progress rapidly, and the large dry ice particles which are rapidly grown as described above become larger in mass and damage the surface of the object to be cleaned.

Therefore, in order to suppress the growth of the dry ice particles at most, it is most important to minimize a distance that liquid carbon dioxide moves within the liquid carbon dioxide and to thin a thickness of the end of the liquid carbon dioxide nozzle at most to prevent adsorption and growth of the dry ice particles around the liquid carbon dioxide nozzle.

Meanwhile, since the display has recently been increased in size, an area to be cleaned is also increased and there is a limitation that it is difficult to shorten a cleaning time using a conventional single nozzle.

In order to apply the cleaning technology to a large area of the object to be cleaned due to the increase in size, a wide nozzle type is required, but in a case in which the wide nozzle is formed by simply arranging nozzles in parallel to each other, there is a problem that consumption of liquid carbon dioxide ($CO_2$) is too large and economics are significantly decreased.

DISCLOSURE

Technical Problem

An object of the present invention is to provide a micro dry ice snow spray type cleaning device for a cleaning a surface of an object to be cleaned by adiabatically expanding liquid carbon dioxide to generate sublimable dry ice particles (snow) and carrying the dry ice particles on high-speed carrier gas to be sprayed onto the surface of the object to be cleaned, and particularly, to provide a micro dry ice snow spray type cleaning device capable of effectively preventing damage to a surface of an object to be cleaned by minimizing a generation of water droplets due to a decrease in temperature of a liquid carbon dioxide nozzle and a growth of dry ice particles by the water droplets since an end of the liquid carbon dioxide nozzle further protrudes to the outside relative to an end of a carrier gas nozzle, and being advantageous in an economical aspect by significantly reducing consumption of liquid carbon dioxide since it is possible to easily modify micro liquid carbon dioxide nozzles into a wide nozzle for a large area by arranging the micro liquid carbon dioxide nozzles in parallel to each other.

Technical Solution

According to an aspect of the present invention, a micro dry ice snow spray type cleaning device includes a carrier gas inlet pipe into which carrier gas is injected and in which a carrier gas nozzle for discharging the carrier gas is formed at an end portion thereof; a liquid carbon dioxide transfer pipe installed to penetrate through the inside of the carrier gas inlet pipe and transferring liquid carbon dioxide; a liquid carbon dioxide nozzle provided to an end portion of the liquid carbon dioxide transfer pipe; and a foreign material suction part positioned to surround the carrier gas inlet pipe to suck and remove foreign materials generated during a cleaning.

An end of the liquid carbon dioxide nozzle may further protrude to the outside relative to an end of the carrier gas nozzle.

The end of the liquid carbon dioxide nozzle may be formed in a sharp shape, and a hydrophobic coating may be formed on a surface of the liquid carbon dioxide nozzle.

A growth nozzle may be provided to an end portion of the liquid carbon dioxide transfer pipe, and an end of the growth nozzle may further protrude to the outside relative to an end of the carrier gas nozzle.

According to another aspect of the present invention, a micro dry ice snow spray type cleaning device includes a carrier gas inlet pipe into which carrier gas is injected and in which a plurality of carrier gas nozzles for discharging the carrier gas are formed at an end portion thereof; a plurality of liquid carbon dioxide transfer pipes installed to be parallel to each other in the inside of the carrier gas inlet pipe and transferring liquid carbon dioxide therein; a liquid carbon dioxide nozzle provided to an end portion of the liquid carbon dioxide transfer pipe to discharge the liquid carbon dioxide; and a foreign material suction part positioned to surround the carrier gas inlet pipe to suck and remove foreign materials generated during a cleaning.

An end of the liquid carbon dioxide nozzle may further protrude to the outside relative to an end of the carrier gas nozzle.

The end of the liquid carbon dioxide nozzle may be formed in a sharp shape, and a hydrophobic coating may be formed on a surface of the liquid carbon dioxide nozzle.

A growth nozzle may be provided to an end portion of the liquid carbon dioxide transfer pipe, and an end of the growth nozzle may further protrude to the outside relative to an end of the carrier gas nozzle.

Advantageous Effects

As described above, in cleaning the surface of the object to be cleaned by adiabatically expanding liquid carbon dioxide to generate the sublimable dry ice particles and carrying the dry ice particles on high-speed carrier gas to be sprayed onto the surface of the object to be cleaned, it is possible to prevent the growth of the dry ice particles within the carrier gas nozzle by minimizing the generation of the water droplets due to the decrease in temperature of the liquid carbon dioxide nozzle and the growth of dry ice particles by the water droplets since the end of the liquid carbon dioxide nozzle further protrudes to the outside relative to the end of the carrier gas nozzle, and it is possible to effectively prevent the damage to the surface of the object to be cleaned by forming the hydrophobic coating on the surface of the liquid carbon dioxide nozzle to prevent the formation of the water droplets and to prevent the irregular dry ice particles.

Further, it is possible to easily modify the micro liquid carbon dioxide nozzles into the wide nozzle for the large area by arranging the micro liquid carbon dioxide nozzles in series with or in parallel to each other and it is possible to reduce the consumption of liquid carbon dioxide by applying the wide nozzle suitable for a large area cleaning.

Further, as the dry ice particles are generated using the fine micro liquid carbon dioxide nozzle, it is possible to significantly reduce the consumption of liquid carbon dioxide, and since the liquid carbon dioxide nozzle may be formed in the micro needle structure, it is possible to efficiently clean with a small amount of liquid carbon dioxide.

BEST MODE

A micro dry ice snow spray type cleaning device according to the present invention includes a carrier gas inlet pipe into which carrier gas is injected and in which a carrier gas nozzle for discharging the carrier gas is formed at an end portion thereof; a liquid carbon dioxide transfer pipe installed to penetrate through the inside of the carrier gas inlet pipe and transferring liquid carbon dioxide; a liquid carbon dioxide nozzle provided to an end portion of the liquid carbon dioxide transfer pipe; and a foreign material suction part positioned to surround the carrier gas inlet pipe to suck and remove foreign materials generated during a cleaning.

An end of the liquid carbon dioxide nozzle may further protrude to the outside relative to an end of the carrier gas nozzle.

The end of the liquid carbon dioxide nozzle may be formed in a sharp shape, and a hydrophobic coating may be formed on a surface of the liquid carbon dioxide nozzle.

A growth nozzle may be provided to an end portion of the liquid carbon dioxide transfer pipe, and an end of the growth nozzle may further protrude to the outside relative to an end of the carrier gas nozzle.

Hereinafter, a micro dry ice snow spray type cleaning device according to exemplary embodiments of the present invention will be described in detail with respect to the accompanying drawings.

Figure 1:
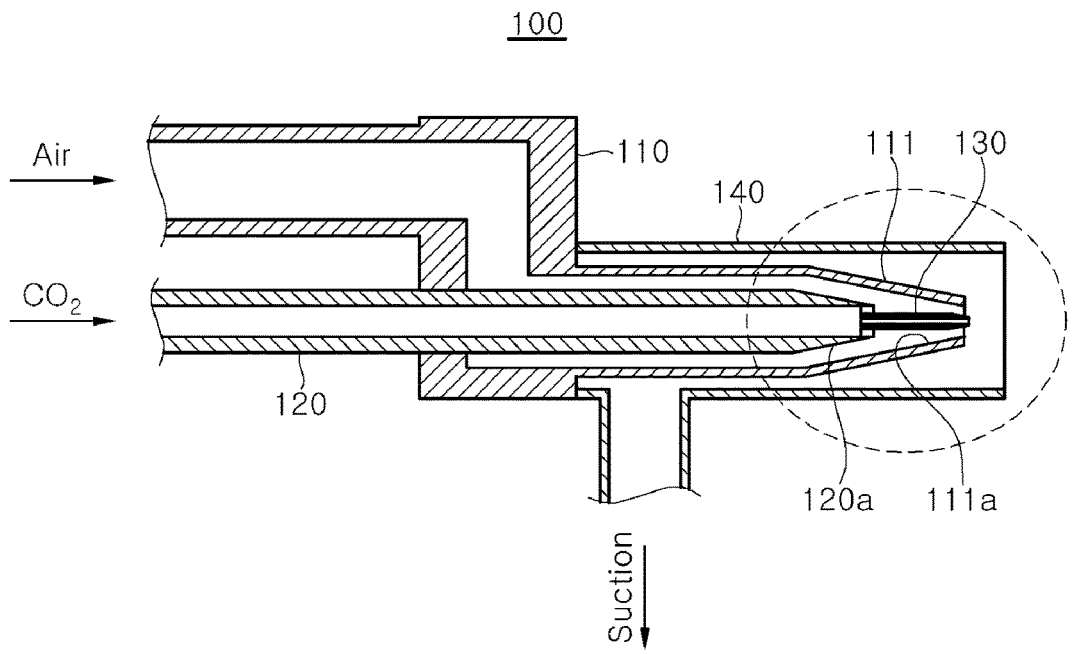
FIG. 1 is a cross-sectional view showing a configuration of a micro dry ice snow spray type cleaning device according to a first exemplary embodiment of the present invention.
Figure 2:
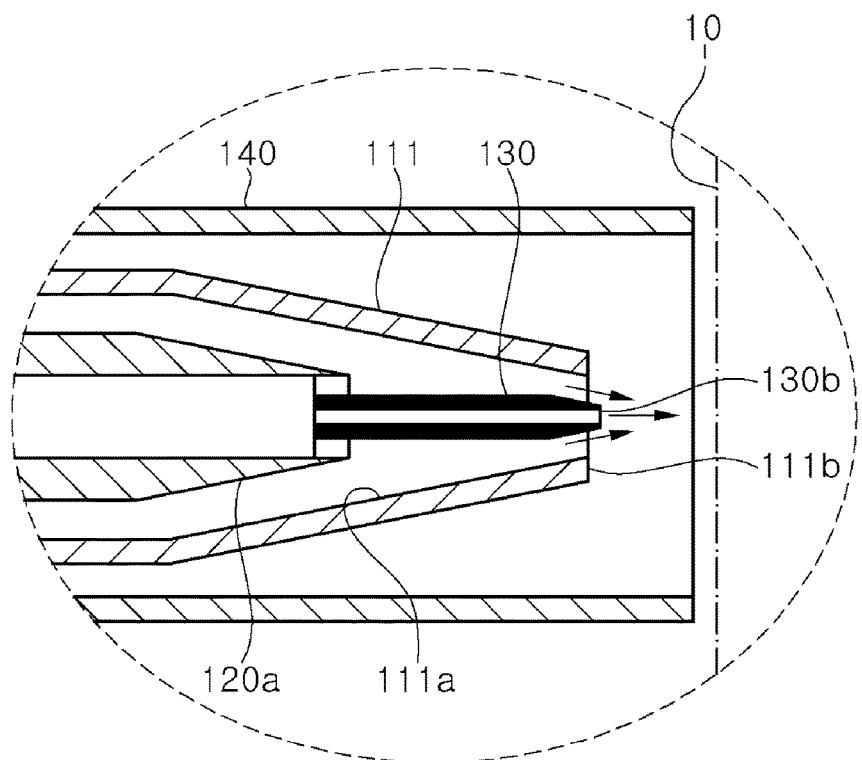
FIG. 2 is an enlarged view of FIG. 1.

FIG. 1 is a cross-sectional view showing a configuration of a micro dry ice snow spray type cleaning device according to a first exemplary embodiment of the present invention and FIG. 2 is an enlarged view of FIG. 1.

As shown in FIGS. 1 and 2, a micro dry ice snow spray type cleaning device 100 according to a first exemplary embodiment of the present invention includes a carrier gas inlet pipe 110, a liquid carbon dioxide transfer pipe 120, a liquid carbon dioxide nozzle 130, and a foreign material suction part 140.

The carrier gas inlet pipe 110 is configured so that carrier gas, for example, nitrogen (N2) gas, clean dry air (CDA), or inert gas is introduced into the inside thereof.

The carrier gas nozzle 111 for discharging the carrier gas is formed at end portion of the carrier gas inlet pipe 110.

The carrier gas nozzle 111 is formed integrally at the end of the carrier gas inlet pipe 110, is configured so that the carrier gas is discharged in high speed through the carrier gas nozzle 111, and serves to accelerate dry ice particles using high-speed carrier gas.

The liquid carbon dioxide transfer pipe 120 is installed to penetrate through the inside of the carrier gas inlet pipe 110, and is configured so that the liquid carbon dioxide is transferred therein.

An end portion of the liquid carbon dioxide transfer pipe 120 is formed in a shape corresponding to the carrier gas nozzle 111. That is, an outer surface 120a of the end portion of the transfer pipe 120 may be formed to be parallel to an inner surface 111a of the carrier gas nozzle 111.

The liquid carbon dioxide nozzle 130 serves to adiabatically expand the liquid carbon dioxide to form and spray fine particles, and is installed at the end portion of the liquid carbon dioxide transfer pipe 120.

An end 130b of the liquid carbon dioxide nozzle 130 is configured to further protrude to the outside relative to an end 111b of the carrier gas nozzle 111. That is, such a structure accelerates the fine dry ice particles occurring from the liquid carbon dioxide nozzle 130 by the carrier gas, and minimizes a decrease in temperature by setting a step with the liquid carbon dioxide nozzle 130.

The liquid carbon dioxide nozzle 130 has a structure of minimizing a growth of the dry ice particles by attached water droplets due to the decrease in temperature according to the adiabatic expansion, and in order to prevent the water droplets from being formed, it is preferable that the end of the liquid carbon dioxide nozzle 130 is formed in a sharp shape and a hydrophobic coating is formed on a surface of the liquid carbon dioxide nozzle 130.

The liquid carbon dioxide transfer pipe 120 and the liquid carbon dioxide nozzle 130 are structures for minimizing a change in pressure of carbon dioxide to minimize a decrease in temperature of liquid carbon dioxide in a relationship between the liquid carbon dioxide transfer pipe 120 and the liquid carbon dioxide nozzle 130.

The foreign material suction part 140 serves to prevent scattering of foreign materials generated during cleaning and to suck and remove the foreign materials, and is installed to surround the carrier gas inlet pipe 110 integrally with the carrier gas inlet pipe 110.

That is, the foreign material suction part 140 keeps an interval of 1 mm to 2 mm from a surface 10 of an object to be cleaned, prevents the foreign materials generated by a high-speed spray of carrier gas from scattering to the outside, and sucks and removes the foreign materials.

An operation and an effect of the micro dry ice snow spray type cleaning device 100 according to the first exemplary embodiment of the present invention having the configuration as described above will be described.

The liquid carbon dioxide is injected into the liquid carbon dioxide transfer pipe 120, and the carrier gas is injected into the carrier gas inlet pipe 110.

The liquid carbon dioxide is discharged through the liquid carbon dioxide nozzle 130 and is adiabatically expanded to generate sublimable dry ice particles, and the dry ice particles are carried on the carrier gas moving in high-speed and are sprayed onto the surface 10 of the object to be cleaned, thereby removing and cleaning foreign materials such as particles by collision energy generated during the spraying.

In this case, the end 130b of the liquid carbon dioxide nozzle 130 is configured to further protrude to the outside relative to the end 111b of the carrier gas nozzle 111, thereby making it possible to effectively prevent damage to the surface 10 of the object to be cleaned by preventing the growth of the dry ice particles in the carrier gas nozzle and preventing the dry ice particles from being irregularly grown, to significantly reduce consumption of the liquid carbon dioxide, and to suppress water droplets and a growth of the dry ice particles.

Figure 3:
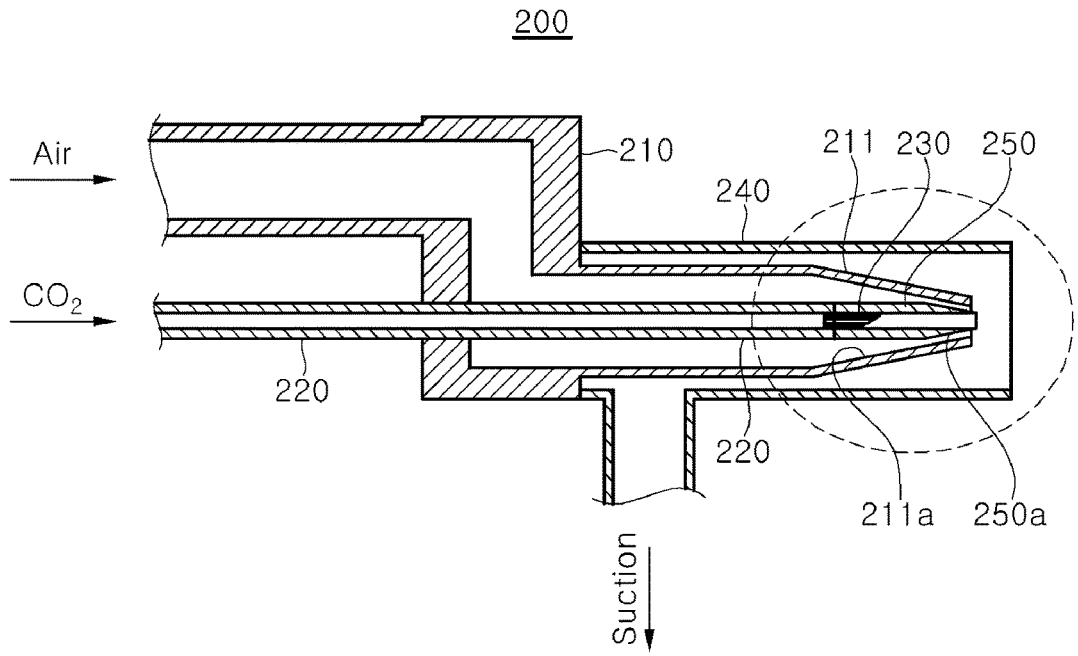
FIG. 3 is a cross-sectional view showing a configuration of a micro dry ice snow spray type cleaning device according to a second exemplary embodiment of the present invention.
Figure 4:
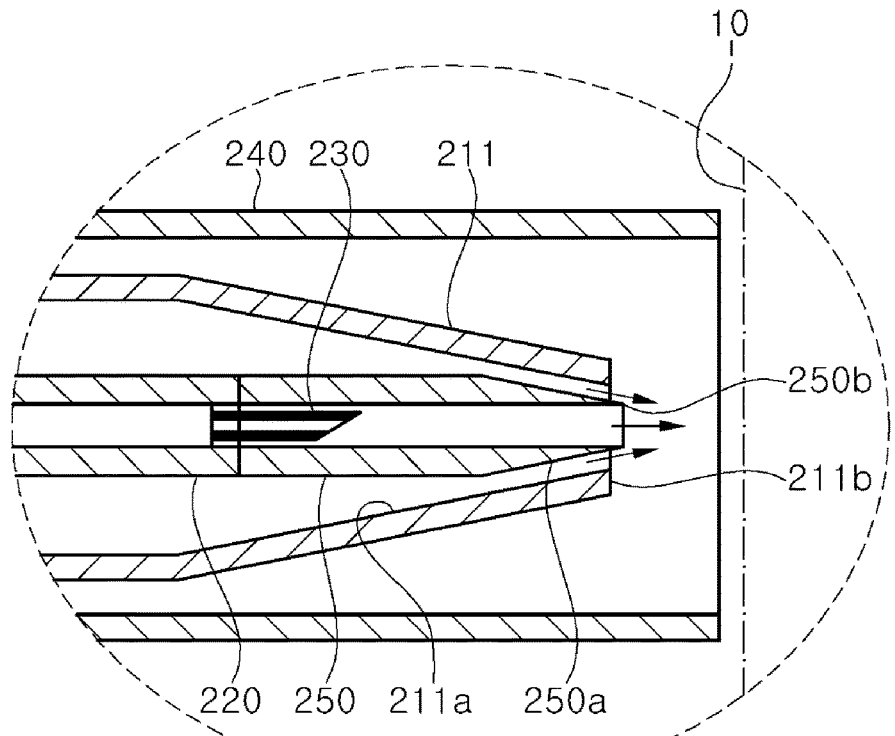
FIG. 4 is an enlarged view of FIG. 3.

Meanwhile, FIG. 3 is a cross-sectional view showing a configuration of a micro dry ice snow spray type cleaning device according to a second exemplary embodiment of the present invention and FIG. 4 is an enlarged view of FIG. 2.

As shown in FIGS. 3 and 4, a micro dry ice snow spray type cleaning device 200 according to a second exemplary embodiment of the present invention includes a carrier gas inlet pipe 210, a liquid carbon dioxide transfer pipe 220, a liquid carbon dioxide nozzle 230, a foreign material suction part 240, a growth nozzle 250.

The carrier gas inlet pipe 210 is configured so that carrier gas, for example, nitrogen (N2) gas, clean dry air (CDA), or inert gas is introduced into the inside thereof.

The carrier gas nozzle 211 for discharging the carrier gas is formed at end portion of the carrier gas inlet pipe 210.

The carrier gas nozzle 211 is formed integrally at the end of the carrier gas inlet pipe 210, is configured so that the carrier gas is discharged in high speed through the carrier gas nozzle 211, and serves to accelerate dry ice particles.

The liquid carbon dioxide transfer pipe 220 is installed to penetrate through the inside of the carrier gas inlet pipe 210, and is configured so that the liquid carbon dioxide is transferred therein.

An end portion of the growth nozzle 250 is formed in a shape corresponding to the carrier gas nozzle 211. That is, an outer surface 250a of the end portion of the growth nozzle 250 is formed to be parallel to an inner surface 211a of the carrier gas nozzle 211.

The liquid carbon dioxide nozzle 230 is installed at an end portion of the liquid carbon dioxide transfer pipe 220, and may be configured in a hollow-type needle structure having an inner diameter which is less than 80 μm.

The liquid carbon dioxide nozzle 230 serves to uniformly spray the liquid carbon dioxide.

The growth nozzle 250 is installed at the end portion of the liquid carbon dioxide transfer pipe 220 at a position covering the liquid carbon dioxide nozzle 230 and serves to grow the dry ice particles.

An end 250b of the growth nozzle 250 is configured to further protrude to the outside relative to an end 211b of the carrier gas nozzle 211. The growth nozzle 250 may adjust force of the nozzle by growing the dry ice particles.

The foreign material suction part 240 is installed at a position surrounding the carrier gas inlet pipe 210 integrally with the carrier gas inlet pipe 210 to prevent scattering of foreign materials generated during cleaning and to suck and remove the foreign materials.

The foreign material suction part 240 keeps an interval of 1 mm to 2 mm from a surface of an object to be cleaned, prevents the foreign materials generated by a high-speed spray of carrier gas from scattering to the outside, and sucks and removes the foreign materials.

As characteristics of the micro dry ice snow spray type cleaning device 200 according to the second exemplary embodiment of the present invention, the growth nozzle 250 is provided to the end portion of the liquid carbon dioxide transfer pipe 220, and the end 250b of the growth nozzle 250 is configured to further protrude to the outside relative to the end 211b of the carrier gas nozzle 221.

An operation and an effect of the micro dry ice snow spray type cleaning device 100 according to the second exemplary embodiment of the present invention having the configuration as described above will be described.

The liquid carbon dioxide is injected into the liquid carbon dioxide transfer pipe 220, and the carrier gas is injected into the carrier gas inlet pipe 210. The liquid carbon dioxide is adiabatically expanded through the growth nozzle 250 to generate sublimable dry ice particles, and the dry ice particles are carried on the carrier gas moving in high-speed and are sprayed onto the surface 10 of the object to be cleaned, thereby removing and cleaning foreign materials such as particles by collision energy generated during the spraying.

The liquid carbon dioxide nozzle 230 and the growth nozzle 250 are formed in a two-stage structure in which they are combined together and the end 250b of the growth nozzle 250 is configured to further protrude to the outside relative to the end 211b of the carrier gas nozzle 211, thereby making it possible to effectively prevent damage to the surface 10 of the object to be cleaned and to significantly reduce consumption of liquid carbon dioxide by preventing a decrease in pressure and preventing the growth of the dry ice particles in the carrier gas nozzle 211.

Further, the foreign material suction part 250 keeps an interval of 1 mm to 2 mm from the surface 10 of the object to be cleaned, prevents the foreign materials generated by a high-speed spray of carrier gas from scattering to the outside, and efficiently sucks and removes the foreign materials.

Figure 5:
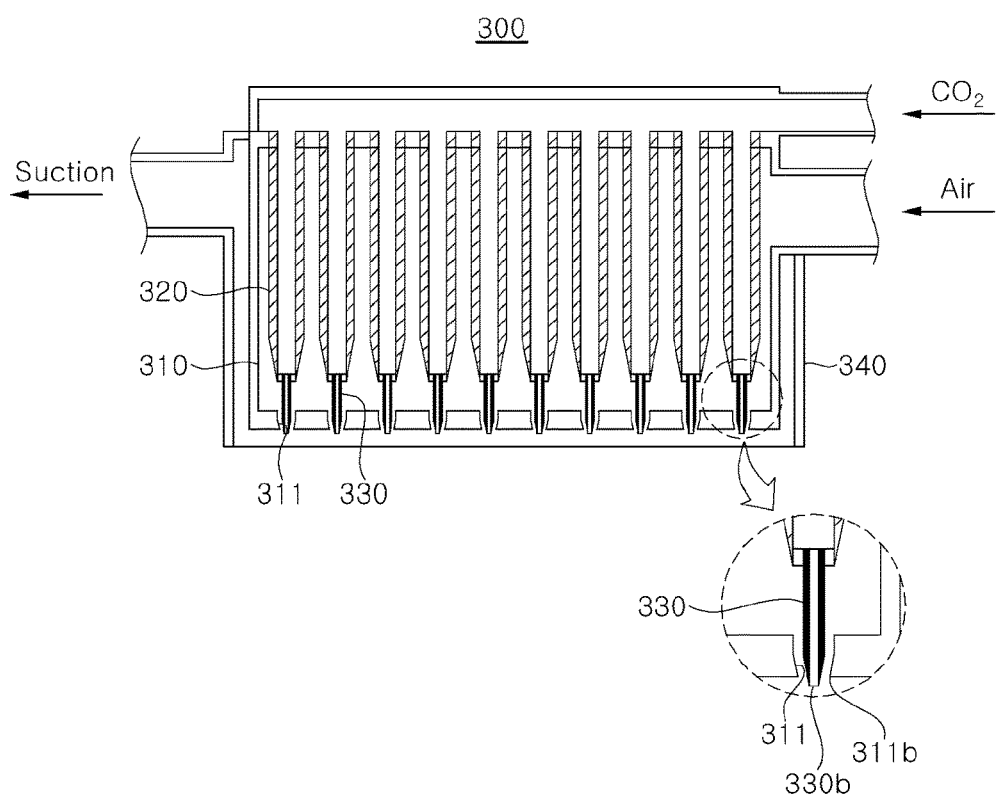
FIG. 5 is a cross-sectional view showing a configuration of a micro dry ice snow spray type cleaning device according to a third exemplary embodiment of the present invention.

Meanwhile, FIG. 5 is a cross-sectional view showing a configuration of a micro dry ice snow spray type cleaning device according to a third exemplary embodiment of the present invention.

As shown in FIG. 5, a micro dry ice snow spray type cleaning device 300 according to a third exemplary embodiment of the present invention includes a carrier gas inlet pipe 310 of a box shape, a plurality of liquid carbon dioxide transfer pipes 320, a liquid carbon dioxide nozzle 330, and a foreign material suction part 340.

The carrier gas inlet pipe 310 is configured so that carrier gas, for example, nitrogen (N2) gas, clean dry air (CDA), or inert gas is introduced into the inside thereof.

The carrier gas inlet pipe 310 is configured in a box shape, and carrier gas nozzles 311 for discharging carrier gas are formed at a uniform interval at an end portion of the carrier gas inlet pipe 310.

The carrier gas nozzle 311 is formed integrally with the carrier gas inlet pipe 310, and is configured so that the carrier gas is discharged in high speed through the carrier gas nozzle 311.

The liquid carbon dioxide transfer pipe 320 is installed in the inside of the carrier gas inlet pipe 310, and is configured so that the liquid carbon dioxide is transferred therein.

The liquid carbon dioxide nozzle 330 serves to adiabatically expand the liquid carbon dioxide to form and spray fine particles, and is installed at the end portion of the liquid carbon dioxide transfer pipe 320.

The end 330b of the liquid carbon dioxide nozzle 330 is configured to further protrude to the outside relative to the end 311b of the carrier gas nozzle 311, thereby making it possible to effectively prevent damage to the surface 10 of the object to be cleaned by preventing the growth of the dry ice particles in the carrier gas nozzle and preventing the dry ice particles from being irregularly grown, to significantly reduce consumption of the liquid carbon dioxide, and to effectively suppress water droplets and a growth of the dry ice particles.

The end of the liquid carbon dioxide nozzle 330 is formed in a sharp shape, and a hydrophobic coating may be formed on the surface of the liquid carbon dioxide nozzle 330.

It is possible to easily modify the micro liquid carbon dioxide nozzles 330 into a wide nozzle for cleaning a large area by arranging the micro liquid carbon dioxide nozzles 330 in parallel to each other, thereby reducing consumption of liquid carbon dioxide.

The foreign material suction part 340 is installed at a position surrounding the carrier gas inlet pipe 310 in the carrier gas inlet pipe 310 to prevent scattering of foreign materials generated during cleaning and to suck and remove the foreign materials.

The foreign material suction part 340 keeps an interval of 1 mm to 2 mm from the surface 10 (see FIG. 1) of the object to be cleaned, prevents the foreign materials generated by a high-speed spray of carrier gas from scattering to the outside, and sucks and removes the foreign materials.

An operation and an effect of the micro dry ice snow spray type cleaning device 300 according to the third exemplary embodiment of the present invention having the configuration as described above will be described.

The liquid carbon dioxide is injected into the liquid carbon dioxide transfer pipe 320, and the carrier gas is injected into the carrier gas inlet pipe 310. The liquid carbon dioxide is adiabatically expanded through the liquid carbon dioxide nozzle 330 to generate sublimable dry ice particles, and the dry ice particles are carried on the carrier gas moving in high-speed and are sprayed onto the surface 10 of the object to be cleaned, thereby removing and cleaning foreign materials such as particles by collision energy generated during the spraying.

The end 330b of the liquid carbon dioxide nozzle 330 is configured to further protrude to the outside relative to the end 311b of the carrier gas nozzle 311, thereby making it possible to effectively prevent damage to the surface of the object to be cleaned by preventing the growth of the dry ice particles in the carrier gas nozzle and to significantly reduce consumption of the liquid carbon dioxide.

Further, the foreign material suction part 340 keeps an interval of 1 mm to 2 mm from the surface 10 (see FIG. 1) of the object to be cleaned, prevents the foreign materials generated by a high-speed spray of carrier gas from scattering to the outside, and efficiently sucks and removes the foreign materials.

Figure 6:
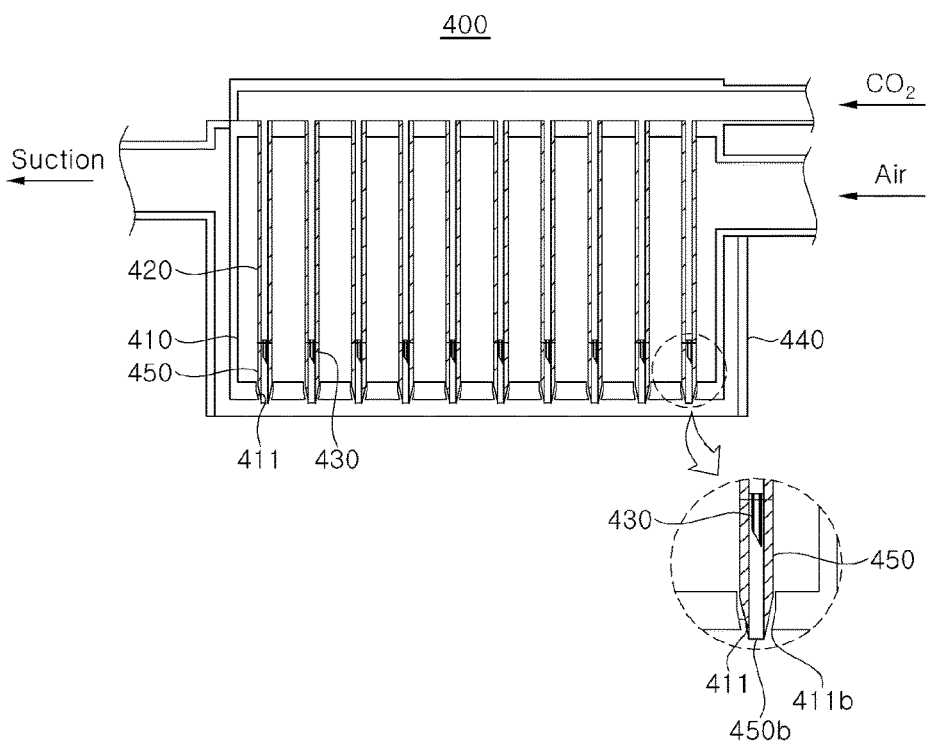
FIG. 6 is a cross-sectional view showing a configuration of a micro dry ice snow spray type cleaning device according to a fourth exemplary embodiment of the present invention.

Meanwhile, FIG. 6 is a cross-sectional view showing a configuration of a micro dry ice snow spray type cleaning device according to a fourth exemplary embodiment of the present invention.

As shown in FIG. 6, a micro dry ice snow spray type cleaning device 400 according to a fourth exemplary embodiment of the present invention includes a carrier gas inlet pipe 410, a plurality of liquid carbon dioxide transfer pipes 420, a liquid carbon dioxide nozzle 430, a growth nozzle 450, and a foreign material suction part 440.

The carrier gas inlet pipe 410 is configured so that carrier gas, for example, nitrogen (N2) gas, clean dry air (CDA), or inert gas is introduced into the inside thereof.

The carrier gas inlet pipe 410 is configured in a box shape, and carrier gas nozzles 411 for discharging carrier gas are formed at a uniform interval at an end portion of the carrier gas inlet pipe 410.

The carrier gas nozzle 411 is formed integrally with the carrier gas inlet pipe 410, and is configured so that the carrier gas is discharged in high speed through the carrier gas nozzle 411.

The liquid carbon dioxide transfer pipe 420 is installed in the inside of the carrier gas inlet pipe 410, and is configured so that the liquid carbon dioxide is transferred therein.

The liquid carbon dioxide nozzle 430 is installed at an end portion of the liquid carbon dioxide transfer pipe 420, and is configured to be positioned in the inside of the growth nozzle 450. The liquid carbon dioxide nozzle 430 may be configured in a hollow type needle structure having an inner diameter which is less than 80 μm.

The growth nozzle 450 is installed at the end portion of the liquid carbon dioxide transfer pipe 420, and is configured so that an end 450b of the growth nozzle 450 further protrudes to the outside relative to an end 411b of the carrier gas nozzle 411. The growth nozzle 250 may adjust force of the nozzle by growing the dry ice particles.

It is possible to easily modify the micro liquid carbon dioxide nozzles 430 into a wide nozzle for cleaning a large area by arranging the micro liquid carbon dioxide nozzles 430 in parallel to each other, and it is possible to reduce consumption of liquid carbon dioxide even when applied to the wide nozzle suitable for the large area cleaning.

The foreign material suction part 440 is installed at a position surrounding the carrier gas inlet pipe 410 to prevent scattering of foreign materials generated during cleaning and to suck and remove the foreign materials.

The foreign material suction part 440 keeps an interval of 1 mm to 2 mm from the surface 10 (see FIG. 2) of the object to be cleaned, prevents the foreign materials generated by a high-speed spray of carrier gas from scattering to the outside, and sucks and removes the foreign materials.

An operation and an effect of the micro dry ice snow spray type cleaning device 400 according to the fourth exemplary embodiment of the present invention having the configuration as described above will be described.

The liquid carbon dioxide is injected into the liquid carbon dioxide transfer pipe 420, and the carrier gas is injected into the carrier gas inlet pipe 410.

The liquid carbon dioxide is adiabatically expanded through the growth nozzle 450 to generate sublimable dry ice particles, and the dry ice particles are carried on the carrier gas moving in high-speed and are sprayed onto the surface 10 of the object to be cleaned, thereby removing and cleaning foreign materials such as particles by collision energy generated during the spraying.

The end 450b of the growth nozzle 450 is configured to further protrude to the outside relative to the end 411b of the carrier gas nozzle 411, thereby making it possible to effectively prevent damage to the surface 10 of the object to be cleaned by preventing the growth of the dry ice particles in the carrier gas nozzle 411 and to significantly reduce the consumption of the liquid carbon dioxide.

Further, the foreign material suction part 440 keeps an interval of 1 mm to 2 mm from the surface 10 (see FIG. 2) of the object to be cleaned, prevents the foreign materials generated by a high-speed spray of carrier gas from scattering to the outside, and efficiently sucks and removes the foreign materials.

INDUSTRIAL APPLICABILITY

As described above, in the dry cleaning technology of cleaning the surface of the object to be cleaned by adiabatically expanding liquid carbon dioxide to generate the sublimable dry ice particles and carrying the dry ice particles on high-speed carrier gas to be sprayed onto the surface of the object to be cleaned, it is possible to prevent the growth of the dry ice particles within the carrier gas nozzle by minimizing the growth of the dry ice particles by the attached water droplets due to the decrease in temperature of the liquid carbon dioxide nozzle since the end of the liquid carbon dioxide further protrudes to the outside relative to the end of the carrier gas nozzle, and it is possible to effectively prevent the damage to the surface of the object to be cleaned by forming the hydrophobic coating on the surface of the liquid carbon dioxide nozzle to prevent the formation of the water droplets and to prevent the irregular dry ice particles.

Further, it is possible to easily modify the micro liquid carbon dioxide nozzles into the wide nozzle for the large area by arranging the micro liquid carbon dioxide nozzles in series with or in parallel to each other and it is possible to reduce the consumption of liquid carbon dioxide by applying the wide nozzle suitable for the large area cleaning.

Further, as the dry ice particles are generated using the fine micro liquid carbon dioxide nozzle, it is possible to significantly reduce the consumption of liquid carbon dioxide, and since the liquid carbon dioxide nozzle may be formed in the micro needle structure, it is possible to efficiently clean with a small amount of liquid carbon dioxide.

The invention claimed is:

1. A micro dry ice snow spray type cleaning device comprising:
    a carrier gas inlet pipe into which carrier gas is injected and in which a carrier gas nozzle for discharging the carrier gas is formed at an end portion of the carrier gas inlet pipe;
    a liquid carbon dioxide transfer pipe installed to penetrate through the inside of the carrier gas inlet pipe and transferring liquid carbon dioxide;
    a liquid carbon dioxide nozzle provided to an end portion of the liquid carbon dioxide transfer pipe; and
    a foreign material suction part positioned to surround the carrier gas inlet pipe to suck and remove foreign materials generated during cleaning,
    wherein a growth nozzle is provided to the end portion of the liquid carbon dioxide transfer pipe, and an end of the growth nozzle further protrudes outwards relative to an end of the carrier gas nozzle.

2. The micro dry ice snow spray type cleaning device of claim 1, wherein an end of the liquid carbon dioxide nozzle is formed in a sharp shape, and
    a hydrophobic coating is formed on a surface of the liquid carbon dioxide nozzle.

3. A micro dry ice snow spray type cleaning device comprising:
    a carrier gas inlet pipe into which carrier gas is injected and in which a plurality of carrier gas nozzles for discharging the carrier gas are formed at an end portion of the carrier gas inlet pipe;
    a plurality of liquid carbon dioxide transfer pipes installed to be parallel to each other in the inside of the carrier gas inlet pipe and transferring liquid carbon dioxide;
    a liquid carbon dioxide nozzle provided to an end portion of each the plurality of liquid carbon dioxide transfer pipes to discharge the liquid carbon dioxide; and
    a foreign material suction part positioned to surround the carrier gas inlet pipe to suck and remove foreign materials generated during cleaning, wherein a growth nozzle is provided to the end portion of each of the liquid carbon dioxide transfer pipes, and an end of the growth nozzle further protrudes outwards relative to an end of each of the plurality of carrier gas nozzles.

4. The micro dry ice snow spray type cleaning device of claim 3, wherein an end of the liquid carbon dioxide nozzle is formed in a sharp shape, and a hydrophobic coating is formed on a surface of the liquid carbon dioxide nozzle.

5. A micro dry ice snow spray type cleaning device comprising:

a carrier gas inlet pipe into which carrier gas is injected and in which a carrier gas nozzle for discharging the carrier gas is formed at an end portion of the carrier gas inlet pipe;

a liquid carbon dioxide transfer pipe installed to penetrate through the inside of the carrier gas inlet pipe and transferring liquid carbon dioxide;

a liquid carbon dioxide nozzle provided to an end portion of the liquid carbon dioxide transfer pipe; and a foreign material suction part positioned to surround the carrier gas inlet pipe to suck and remove foreign materials generated during cleaning, wherein an end of the liquid carbon dioxide nozzle further protrudes outwards relative to an end of the carrier gas nozzle, and wherein the end of the liquid carbon dioxide nozzle is formed in a sharp shape, and a hydrophobic coating is formed on a surface of the liquid carbon dioxide nozzle.

\* \* \* \* \*